US009240395B2

(12) United States Patent
Chan et al.

(10) Patent No.: US 9,240,395 B2
(45) Date of Patent: Jan. 19, 2016

(54) WATERPROOF SURFACE MOUNT DEVICE PACKAGE AND METHOD

(75) Inventors: Alex Chi Keung Chan, Sheung Shui (HK); Charles Chak Hau Pang, Fanling (HK); Li Fei Hong, Huizhou (CN)

(73) Assignee: CREE HUIZHOU OPTO LIMITED, Huizhou Municipality, Guangdong Province (CN)

( * ) Notice: Subject to any disclaimer, the term of this patent is extended or adjusted under 35 U.S.C. 154(b) by 0 days.

(21) Appl. No.: 12/957,225

(22) Filed: Nov. 30, 2010

(65) Prior Publication Data

US 2012/0132937 A1 May 31, 2012

(51) Int. Cl.
*H01L 27/15* (2006.01)
*H01L 33/56* (2010.01)
(Continued)

(52) U.S. Cl.
CPC ............. *H01L 25/0753* (2013.01); *H01L 33/62* (2013.01); *H01L 2224/32245* (2013.01); *H01L 2224/45144* (2013.01); *H01L 2224/48097* (2013.01); *H01L 2224/48247* (2013.01); *H01L 2224/48257* (2013.01); *H01L 2224/73265* (2013.01); *H01L 2924/09701* (2013.01)

(58) Field of Classification Search
CPC ..... H01L 33/057; H01L 27/12; H01L 33/075; H01L 33/056; H01L 33/061; H01L 27/121; H01L 33/059; H01L 27/15; H01L 33/56; H01L 33/08; H01L 33/38; H01L 33/50
USPC .......... 257/99, 88, 89, 79, 80, 82, 83, 84, 98, 257/290, 291, 184, 431, 13, 591, 784
See application file for complete search history.

(56) References Cited

U.S. PATENT DOCUMENTS

| 4,946,547 A | 8/1990 | Palmour |
| 5,200,022 A | 4/1993 | Kong |
| 5,266,817 A * | 11/1993 | Lin .................................. 257/89 |

(Continued)

FOREIGN PATENT DOCUMENTS

| CN | 101388161 | 3/2009 |
| CN | 201294227 | 8/2009 |

(Continued)

OTHER PUBLICATIONS

International Search Report and Written Opinion for PCT/CN2011/077823 mailed Oct. 20, 2011.

(Continued)

*Primary Examiner* — Chuong A Luu
(74) *Attorney, Agent, or Firm* — Koppel, Patrick, Heybl & Philpott (57) ABSTRACT

The present invention is directed to LED packages and methods utilizing waterproof and UV resistant packages with improved structural integrity. In some embodiments, the improved structural integrity is provided by various features in the lead frame that the casing material encompasses to improve the adhesion between the lead frame and the casing for a stronger, waterproof package. Moreover, in some embodiments the improved structural integrity and waterproofing is further provided by improved adhesion between the encapsulant and the casing. Some embodiments also provide for improved wire bonds, with the length, thickness, and loop height of the wire bonds controlled and optimized for improved adhesion between the wire bonds and the encapsulant as well as improved reliability.

28 Claims, 5 Drawing Sheets

(51) Int. Cl.
*H01L 25/075* (2006.01)
*H01L 33/62* (2010.01)

(56) References Cited

U.S. PATENT DOCUMENTS

| | | | |
|---|---|---|---|
| RE34,861 E | 2/1995 | Davis | |
| 7,394,148 B2* | 7/2008 | Karnezos | 257/686 |
| 8,288,793 B2 | 10/2012 | Kim et al. | 257/99 |
| 2004/0046242 A1 | 3/2004 | Asakawa | 257/678 |
| 2004/0079957 A1 | 4/2004 | Andrews et al. | 257/100 |
| 2004/0120155 A1 | 6/2004 | Suenaga | 362/362 |
| 2006/0102918 A1 | 5/2006 | Su et al. | 257/99 |
| 2007/0262328 A1* | 11/2007 | Bando | 257/79 |
| 2007/0295975 A1 | 12/2007 | Omae | 257/89 |
| 2008/0012036 A1 | 1/2008 | Loh et al. | 257/99 |
| 2008/0041625 A1 | 2/2008 | Cheong | |
| 2008/0093720 A1* | 4/2008 | Hiew et al. | 257/679 |
| 2008/0277685 A1 | 11/2008 | Kim et al. | |
| 2009/0050907 A1* | 2/2009 | Yuan et al. | 257/88 |
| 2009/0057850 A1 | 3/2009 | Moy | |
| 2009/0072251 A1* | 3/2009 | Chan et al. | 257/89 |
| 2009/0129085 A1* | 5/2009 | Aizar et al. | 362/247 |
| 2009/0230413 A1 | 9/2009 | Kobayakawa et al. | |
| 2009/0283781 A1 | 11/2009 | Chan et al. | |
| 2010/0084681 A1 | 4/2010 | Nakajima et al. | 257/99 |
| 2010/0090239 A1 | 4/2010 | Lin et al. | 257/98 |
| 2010/0155748 A1* | 6/2010 | Chan et al. | 257/89 |
| 2010/0193816 A1 | 8/2010 | Liu | 257/98 |
| 2010/0237378 A1* | 9/2010 | Lin et al. | 257/99 |
| 2011/0095316 A1 | 4/2011 | Chen et al. | 257/98 |
| 2012/0235187 A1 | 9/2012 | Ng et al. | 257/98 |

FOREIGN PATENT DOCUMENTS

| | | |
|---|---|---|
| CN | 201294227 Y | 8/2009 |
| CN | 102214647 | 10/2011 |
| EP | 2148369 A1 | 1/2010 |
| JP | 058960 | 2/1993 |
| JP | 2004228387 | 8/2004 |
| JP | 200847916 | 2/2008 |
| JP | 200898218 | 4/2008 |
| JP | 2008218764 | 9/2008 |
| JP | 2009200403 | 9/2009 |
| TW | I245437 | 6/2006 |
| WO | WO 2010/081403 A1 | 7/2010 |
| WO | WO 2010081403 | 7/2010 |

OTHER PUBLICATIONS

Pub No. 2007-0262328, Date Nov. 15, 2007, Bando.
International Search Report and Written Opinion for Appl. No. PCT/CN2010/001864, Dated Nov. 22, 2010.
U.S. Appl. No. 11/656,759, filed Jan. 22, 2007, Ashay Chitnis.
U.S. Appl. No. 11/899,790, filed Sep. 7, 2007, Ashay Chitnis.
U.S. Appl. No. 11/473,089, filed Jun. 21, 2006, Eric J. Tarsa.
Pub No. 2010-0155748, Date Jun. 24, 2010, Chan.
International Preliminary Report and Written Opinion for PCT Patent Application No. PCT/CN2010/001864, dated Oct. 26. 2012.
Notification of Rectification from Chinese Patent Appl. No. 2013-10208431.2. dated Sep. 23, 2013.
First Notification of Rectification from Chinese Patent Appl. No. 2013-20304753.2. dated Sep. 24, 2013.
Office Action from U.S. Appl. No. 12/939,096, dated Feb. 5, 2014.
Office Action from U.S. Appl. No. 13/192,293, dated Jan. 16, 2014.
Second Notification of Rectification from Chinese Patent Appl. No. 201320304753.2, dated Jan. 2, 2014.
Office Action from U.S. Appl. No. 13/192,293, dated Aug. 15, 2014.
Office Action from Japanese Patent Appl. No. 2013-504088, dated Jul. 1, 2014.
Office Action from Japanese Appl. No. 2013-504088, dated Jun. 2, 2015.
First Office Action from Chinese Patent Appl. No. 201180053012.5. dated Jul. 3, 2015.
First Office Action from Chinese Patent appl. No. 2011800455336. dated May 29, 2015.
Second Office Action from Chinese Patent appl. No. 201010621778.6. dated Jul. 13, 2015.
Office Action from U.S. Appl. No. 13/904,282, dated Jun. 11, 2015.
Office Action from U.S. Appl. No. 12/758,702, dated: Oct. 9, 2012.
Response to Office Action from U.S. Appl. No. 12/758,702, filed Jan. 3, 2013.
Office Action from U.S. Appl. No. 12/758,702, dated: Mar. 12, 2013.
Response to Office Action from U.S. Appl. No. 12/758,702, filed Jul. 12, 2013.
Office Action from U.S. Appl. No. 12/939,096, dated: Nov. 13, 2012.
Response to Office Action from U.S. Appl. No. 12/939,096, filed Feb. 13, 2013.
Office Action from U.S. Appl. No. 12/939,096, dated: Feb. 28, 2013.
Response to Office Action from U.S. Appl. No. 12/939,096, filed May 28, 2013.
Office Action from U.S. Appl. No. 12/939,096, dated: Jun. 24, 2013.
Office Action from U.S. Appl. No. 13/192,293, dated: Aug. 27, 2013.
Office Action from U.S. Appl. No. 12/758,702, dated Oct. 9, 2012.
Respcnse to OA from U.S. Appl. No. 12/758,702, filed Jan. 3, 2013.
Office Action from U.S. Appl. No. 12/758,702, dated Mar. 12, 2013.
Response to OA from U.S. Appl. No 12/758,702, filed Jul. 12, 2013.
Office Action from U.S. Appl. No. 12/939,096, dated Nov. 13, 2012.
Respcnse to OA from U.S. Appl. No. 12/939,096, filed Feb. 13, 2013.
Office Action from U.S. Appl. No. 12/939,096, dated Feb. 28, 2013.
Response to OA from U.S. Appl. No. 12/939,096, filed May 28, 2013.
Office Action from U.S. Appl. No. 12/939,096, dated Jun. 24, 2013.
Office Action from U.S. Appl. No. 13/192,293, dated Aug. 27, 2013.
Office Action from U.S. Appl. No. 12/758,702, dated May 17, 2013.
Supplementary European Search Report from European Patent Appl. No. 10849646.4-1551/2559065, dated Apr. 9. 2015.
Office Action from Chinese Patent Appl. No. 201010621778.6, dated Dec. 31, 2014.
Extended European Search Report from European Appl. No. 10849646.4-1551, dated Mar. 19, 2015.
Office Action from U.S. Appl. No. 13/904,282, dated Mar. 3, 2015.
Office Action from U.S. Appl. No. 12/939,096, dated Apr. 8, 2015.
Office Action from U.S. Appl. No. 13/192,293, dated Apr. 21, 2015.

* cited by examiner

WATERPROOF SURFACE MOUNT DEVICE PACKAGE AND METHOD

BACKGROUND OF THE INVENTION

1. Field of the Invention

The present invention relates generally to electronic packaging, and more particularly to water and weather proof packaging having multiple emitters.

2. Description of the Related Art

Light emitting diodes (LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In recent years, there have been dramatic improvements in LED technology such that LEDs with increased brightness and color fidelity, smaller footprints, and overall improved emitting efficiency have been introduced. LEDs also have an increased operation lifetime compared to other emitters. For example, the operational lifetime of an LED can be over 50,000 hours, while the operational lifetime of an incandescent bulb is approximately 2,000 hours. LEDs can also be more robust than other light sources while consuming less power. For these and other reasons, LEDs are becoming more popular and are now being used in more and more applications that have traditionally been the realm of incandescent, fluorescent, halogen and other emitters.

Due at least in part to these improved LEDs and improved image processing technology, LEDs can be used as the light source for a variety of display types. In order to use LED chips in these types of applications, it is known in the art to enclose one or more LED chips in a package to provide environmental and/or mechanical protection, color selection, light focusing and the like. An LED package also includes electrical leads, contacts or traces for electrically connecting the LED package to an external circuit. The LED packages are commonly mounted on a printed circuit board (PCB).

Different LED packages can be used as the light source for indoor or outdoor displays of varying sizes, and are expected to withstand a variety of environmental conditions. These LED-based displays can comprise thousands of "pixels" or "pixel modules", each of which can contain a plurality of LEDs. The pixel modules can use high efficiency and high brightness LEDs that allow the displays to be visible from various distances and in a variety of environmental lighting conditions. The pixel modules can have as few as three or four LEDs that allow the pixel to emit many different colors of light from combinations of red, green, blue, and/or sometimes yellow light.

Most conventional LED based displays are controlled by a computer system that accepts an incoming signal (e.g. TV signal), and based on the particular color needed at the pixel module to form the overall display image, the computer system determines which LED(s) in each of the pixel modules is to emit light and how brightly. Conductors are provided to apply the appropriate power signal to each of the LEDs in the pixel modules. A power system can also be included that provides power to each of the pixel modules; the power to each of the LEDs can be modulated so light is emitted at the desired brightness. The pixel modules can have as few as three or four LEDs that allow the pixel to emit many different colors of light from combinations of red, green, blue, and/or sometimes yellow light.

LED-based displays are becoming more common in outdoor applications and/or other locations with possible extreme environmental conditions. As their popularity increases, it is important for LED packages incorporated into such displays to withstand potentially harsh environmental conditions and water infiltration. The packages are expected to maintain their structural integrity during manufacture and use, but the integrity of such packages can become compromised.

For example, current packages in the art can experience separation between the package casing and the leads/lead frame. Such separation can allow environmental contaminants such as water and dirt to enter the package, and can reduce the overall life of the package. Furthermore, the package structures can become compromised during manufacture and use. For example, the wire bonds may become detached from the chip carrier pads and connection pads and/or may break.

SUMMARY OF THE INVENTION

The present invention provides emitter packages and LED displays optimized for use outdoors and/or in extreme environmental conditions, with the emitter packages being substantially waterproof and resistant to UV degradation. The emitter packages of the present invention have improved structural integrity, with the wirebonds protected from detachment, bending, and breaking.

One embodiment comprises an emitter package with: a casing comprising a cavity extending into the interior of the casing from a top surface of the casing, an electrically conductive lead frame integral to the casing, a plurality of light emitting devices arranged on conductive carrier parts of the lead frame, with the light emitting devices and portions of the lead frame exposed through the cavity, and a plurality of wire bonds electrically connecting each of the light emitting devices to conductive connection parts of said lead frame, wherein the length, thickness, and loop height of the wire bonds are controlled to improve reliability of the package. The emitter package is substantially UV resistant and waterproof.

Pursuant to another embodiment, an emitter package is provided comprising: a casing with a cavity extending into the interior of the casing from a top surface of the casing, an electrically conductive lead frame integral to the casing, a plurality of light emitting devices arranged on conductive carrier parts of the lead frame, an epoxy encapsulant covering the package and filling the cavity, and a plurality of wire bonds electrically connecting each of the light emitting devices to conductive connection parts of the lead frame. The emitter package is substantially UV resistant and waterproof.

In yet another embodiment according to the present invention, a method for making a waterproof emitter package is provided, with the method comprising: surrounding the lead frame with a casing, incorporating wire bonds to electrically connect light emitting devices disposed on carrier parts of the lead frame to connection parts of the lead frame, controlling the length of the wire bonds at ≤750 μm, incorporating >1.0 mil gold wire into the wire bonds, controlling the loop height of the wire bonds to ≤100 μm, and inserting an epoxy encapsulant over the package and in a cavity through the top of the casing, wherein the encapsulant further surrounds the wire bonds.

These and other further features and advantages of the invention would be apparent to those skilled in the art from the following detailed description, taken together with the accompanying drawings, in which:

BRIEF DESCRIPTION OF THE DRAWINGS

FIG. 5 is an end elevation view of the embodiment shown in FIG. 1, with the opposite end being substantially similar;

FIG. 6 is another end elevation view of the embodiment shown in FIG. 1, with the opposite end being substantially similar;

DETAILED DESCRIPTION OF THE INVENTION

The present invention is described herein with reference to certain embodiments, but it is understood that the invention can be embodied in many different forms and should not be construed as limited to the embodiments set forth herein.

In some embodiments according to the present invention, structures are provided for multiple, linearly-aligned emitter packages that allow the packages to emit a substantially full range of light for use in displays susceptible to adverse environmental conditions. The packages are designed to be substantially resistant to UV degradation and waterproof. To help facilitate the water-resistive features of packages according to some embodiments, encapsulants comprising epoxy are formed over the package and in package cavities.

Moreover, some embodiments of the present invention provide emitter packages that maintain structural integrity during manufacture and use due in part to features in the lead frame enabling the package casing to strongly adhere to the lead frame, thus providing a robust connection between them. Such features may include unique gaps of varying sizes between adjacent portions of the lead frame, cuts, through-holes, indentations, and the like. Structural integrity of the packages may also be realized by closely controlling the length, thickness, and loop height of the wire bonds in each package. By ensuring: shorter wire bonds between each light emitting device and an adjacent connection part of the lead frame; thicker wires for each wire bond; and, lower loop height for each wire bond, there is less likelihood for wire bond breakage, bending, and/or detachment due to application of the encapsulant and/or harsh environmental conditions. Security bonds may also be incorporated to further strengthen wire bonds.

In still other embodiments, methods for producing substantially UV-resistant and waterproof emitter packages are provided. Some of the methods may initially include choosing appropriate materials for the casing and encapsulant, which may include a white plastic and an epoxy respectively. Further, the methods may include incorporating various features in the lead frame to enhance adhesion between the lead frame and the casing. During manufacture of each emitter package, the lead frame may undergo pre-conditioning treatments, which may help improve wire bond strength and enhance adhesion among the lead frame, encapsulant, and casing. The methods may further include controlling the length, thickness, and loop height of each wire bond, all of which may: improve bonding of the wire bonds to portions of the lead frame, enhance adhesion between the wire bonds and the encapsulant, and decrease risks of wire bond breakage, detachment, and deformities during use and manufacture.

The present invention is applicable to different types of emitter packages such as surface mount devices (SMDs) that can be used in many different lighting applications such as LED color screens or decorative lighting. Different embodiments of emitter packages are described below that utilize light emitting diodes as their emitters, but it is understood that other emitter package embodiments can use different types of emitters.

It will be understood that when an element is referred to as being "on", "connected to", "coupled to", or "in contact with" another element, it can be directly on, connected or couple to, or in contact with the other element or intervening elements may be present. In contrast, when an element is referred to as being "directly on", "directly connected to", "directly coupled to", or "directly in contact with" another element, there are no intervening elements present. Likewise, when a first element is referred to as being "in electrical contact with" or "electrically coupled to" a second element, there is an electrical path that permits current flow between the first element and the second element. The electrical path may include capacitors, coupled inductors, and/or other elements that permit current flow even without direct contact between conductive elements.

Although the terms first, second, etc. may be used herein to describe various elements, components, regions, and/or sections, these elements, components, regions, and/or sections should not be limited by these terms. These terms are only used to distinguish one element, component, region, or section from another element, component, region, or section. Thus, a first element, component, region, or section discussed below could be termed a second element, component, regions, or section without departing from the teachings of the present invention.

Embodiments of the invention are described herein with reference to cross-sectional view illustrations that are schematic illustrations of embodiments of the invention. As such, the actual thickness of components can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

FIGS. 1-15 show one possible embodiment of a waterproof, multiple emitter package 10 according to the present invention that comprises an SMD. As mentioned above, it is understood that the present invention can be used with other types of emitter packages beyond SMDs. The package 10 comprises a casing 12 that carries an integral lead frame 14. The lead frame 14 comprises a plurality of electrically conductive connection parts used to conduct electrical signals to the package's light emitters. The lead frame may also assist in dissipating heat generated by the emitters in applications where a significant amount of heat is produce by the package's emitters.

The lead frame 14 can be arranged in many different ways and different numbers of parts can be utilized in different package embodiments. The package 10 is described below utilizing three emitters, and in the embodiment shown, the lead frame is arranged so each of the emitters is driven by a respective electrical signal. Accordingly, there are six conductive parts in the embodiment shown, comprising a pair of conductive parts for each emitter with an electrical signal applied to each of the emitters through its conductive part pair. For the package 10, the conductive parts comprise first, second and third cathode parts 16, 18, 20, each having an emitter attach pad, and first, second and third anode parts 22, 24, 26. However, it is understood that some embodiments can comprise less than three LEDs, while others can comprise less than six LEDs and still others can comprise more than three LEDs. The LEDs in these various embodiments can each have their own respective conductive part pair, or can share conductive parts with other LEDs. The cost and complexity of the packages can be generally lower with fewer LED chips.

The casing 12 can have many different shapes and sizes, and in the embodiment shown is generally square or rectangular, with upper and lower surfaces 28 and 30, side surfaces 32 and 34 and end surfaces 36 and 38. The upper portion of the casing further comprises a recess or cavity 40 extending from the upper surface 28 into the body of the casing 12 to the lead frame 14. Emitters are arranged on the lead frame such that light from the emitters emits from the package 10 through the cavity 40. In some embodiments, a reflector component such as a reflective insert or ring 42 (shown in FIG. 3) may be positioned and secured along at least a portion of a side or wall 44 of the cavity 40.

Figure 12:
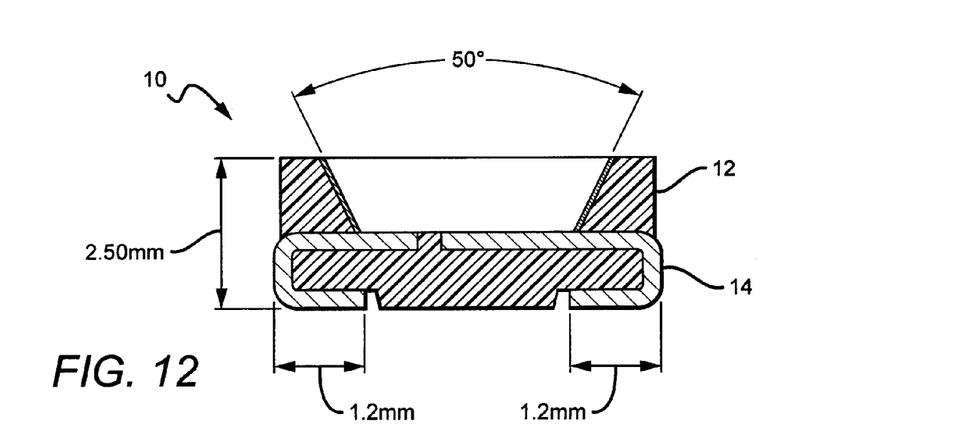
FIG. 12 is a side dimensional view of one embodiment of an emitter package according to the present invention.

The effectiveness of a reflector component (if included) and the emission angle of the package can be enhanced by tapering the cavity 14 (and reflector component if carried therein) inwardly toward the interior of the casing. By way of example and not by limitation, a cavity angle of ~50.0 degrees (as shown in FIG. 12) may provide for a suitable and desired viewing angle as well as the desired reflectivity if a reflector component is included. In other possible embodiments, a cavity angle of less than 50.0 degrees or greater than 50.0 degrees may provide for suitable and desirable viewing angles.

Moreover, the depth of cavity 40 can be customized to alter the viewing angle of the package. It is understood that generally, the deeper the cavity is, the smaller the resulting viewing angle is, and the shallower the cavity is, the greater the resulting viewing angle is. Accordingly, the depth of the cavity will be at least dependent on the desired end use of the emitter package.

In some embodiments, the cavity 40 may be at least partially filled with an encapsulant 48 that can protect and positionally stabilize the lead frame 14, the emitters carried thereby, and wire bonds 95, 97, 99 connecting each emitter to an adjacent connection portion of the lead frame. In some instances, the encapsulant 48 may completely cover the emitters and the portions of the lead frame 14 exposed through the cavity 40. The encapsulant 48 may be selected to have predetermined optical properties to enhance the projection of light from the LEDs, and in some embodiments is substantially transparent to the light emitted by the package's emitters. The encapsulant 48 may be substantially flat along its top surface, can be shaped (such as into a hemisphere or bullet shape), or can be fully or partially concave in the cavity 40. The encapsulant 48 may be formed from an epoxy, silicone, resin, thermoplastic polycondensate, glass, and/or other suitable materials or combinations of materials, with a preferred material demonstrating exceptional waterproof characteristics and substantial resistance to UV damage and other adverse environmental conditions. Additionally, in some embodiments, materials may be added to the encapsulant 48 to enhance the emission, absorption and/or dispersion of light to and/or from the LEDs, as well as the UV-resistive characteristics of the encapsulant.

The casing 12 may be fabricated of material that is electrically insulating; it may also be thermally conductive. Such materials are well-known in the art and may include, without limitation, thermoplastic polycondensates (e.g., a polyphthalamide (PPA)), certain ceramics, resins, epoxies, and glass. The casing 12 may also be formed of light or white material(s) to improve color mixing in image generation SMD packages, such as with SMDs employed in outdoor displays.

The package 10 and its casing 12 may be formed and/or assembled through any one of a variety of known methods as is known in the art. For example, the casing 12 may be formed or molded around the cathode parts 16, 18, 20 and anode parts 22, 24, 26, such as by injection molding. The hole 47 shown in FIG. 4 may be present in packages formed by known injection molding techniques, as it represents the point of entry for casing material to be injection molded over said lead frame 14. Alternatively, the casing may be formed in sections, for example, top and bottom sections, with the cathode parts 16, 18, 20 and anode parts 22, 24, 26 formed on the bottom section. The top and bottom sections can then be bonded together using known methods and materials, such as by an epoxy, adhesive or other suitable joinder material.

In the illustrative embodiment depicted, the package 10 utilizes first, second and third LEDs 50, 52, 54, each of which can emit the same color of light or different color of light than the others. In the embodiment shown, the LEDs 50, 52, 54 emit red, green, and blue colors, respectively, so that when appropriately energized the LEDs produce, in combination, a substantially full range of colors. Further, when appropriately energized, the LEDs 50, 52, 54 can emit a white light combination of different color temperatures. It is understood that more or less than three LEDs can be utilized in a package according to the present invention, with the LEDs emitting any desired color or color combination.

The package 10 can also comprise elements to protect against damage from electrostatic discharge (ESD). Different elements can be used such as various Zener diodes, different LEDs arranged in parallel and reverse biased to the LED chips 50, 52, 54, surface mount varistors, and lateral Si diodes. In embodiments using a Zener diode, it can be mounted to a separate attach pad using known mounting techniques. When utilizing groups of LEDs coupled in series, only one ESD element is needed for each series group.

LED structures, features, and their fabrication and operation are generally known in the art and only briefly discussed herein. LEDs can have many different semiconductor layers arranged in different ways and can emit different colors. The layers of the LEDs can be fabricated using known processes, with a suitable process being fabrication using metal organic chemical vapor deposition (MOCVD). The layers of the LED chips generally comprise an active layer/region sandwiched between first and second oppositely doped epitaxial layers, all of which are formed successively on a growth substrate or wafer. LED chips formed on a wafer can be singulated and used in different application, such as mounting in a package. It is understood that the growth substrate/wafer can remain as part of the final singulated LED or the growth substrate can be fully or partially removed.

It is also understood that additional layers and elements can also be included in the LEDs, including but not limited to buffer, nucleation, contact and current spreading layers as well as light extraction layers and elements. The active region can comprise single quantum well (SQW), multiple quantum well (MQW), double heterostructure or super lattice structures.

The active region and doped layers may be fabricated from different material systems, with one such system being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In a possible embodiment, the doped layers are gallium nitride (GaN) and the active region is InGaN. In alternative embodiments the doped layers may be AlGaN, aluminum gallium arsenide (AlGaAs) or aluminum gallium indium arsenide phosphide (AlGaInAsP) or aluminum indium gallium phosphide (AlInGaP) or zinc oxide (ZnO).

The growth substrate/wafer can be made of many materials such as silicon, glass, sapphire, silicon carbide, aluminum nitride (AlN), gallium nitride (GaN), with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

LEDs can also comprise additional features such as conductive current spreading structures, current spreading layers, and wire bond pads, all of which can be made of known materials deposited using known methods. Some or all of the LEDs can be coated with one or more phosphors, with the phosphors absorbing at least some of the LED light and emitting a different wavelength of light such that the LED emits a combination of light from the LED and the phosphor. LED chips can be coated with a phosphor using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively, the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference.

Furthermore, LEDs may have vertical or lateral geometry as is known in the art. Those comprising a vertical geometry may have a first contact on a substrate and a second contact on a p-type layer. An electrical signal applied to the first contact spreads into the n-type layer and a signal applied to the second contact spreads into a p-type layer. In the case of Group-III nitride devices, it is well known that a thin semitransparent typically covers some or the entire p-type layer. It is understood that the second contact can include such a layer, which is typically a metal such as platinum (Pt) or a transparent conductive oxide such as indium tin oxide (ITO).

LEDs may also comprise a lateral geometry, wherein both contacts are on the top of the LEDs. A portion of the p-type layer and active region is removed, such as by etching, to expose a contact mesa on the n-type layer. A second lateral n-type contact is provided on the mesa of the n-type layer. The contacts can comprise known materials deposited using known deposition techniques.

In the illustrative embodiment shown, the lead frame's cathode and anode parts 16, 18, 20, 22, 24, 26 project outwardly through the opposed surfaces 36 and 38 of the casing 12. Cathode parts 16, 18, 20 extend from surface 36, and anode parts 22, 24, 26 extend from surface 38. The anode and cathode parts are arranged to operate in pairs to conduct an electrical signal to their respective light emitter when the package 10 is surface mounted for operation. In the embodiment shown, the cathode and anode parts 16, 18, 20, 22, 24, 26 are bent orthogonally to extend outside of and down along their end surfaces 36 and 38 of the casing, then bent orthogonally again to form end portions 82, 84, 86, 88, 90, 92 that extend along the lower surface 30 of the casing 12. The outwardly facing surfaces of the end portions 82, 84, 86, 88, 90, 92 of the leads are substantially flush with the bottom of the casing 12 to facilitate connection with an underlying mechanical and/or electronic support structure 94 such as a PCB.

As best shown in FIGS. 3, 5, 6, 7, 10, and 12, the portions of cathode parts 16, 18, 20 and anode parts 22, 24, 26 exposed along the outside length of surfaces 36 and 38 will be collectively referred to as solder pins 21, 23. The length of the solder pins 21, 23 can be customized to alter the amount of the lead frame 14 that will be exposed at the end surfaces 36, 38 of a package. Some package embodiments will preferably minimize the length of the solder pins 21, 23 so as to minimize the area of the lead frame exposed through the end surfaces and/or to accommodate a thin/low profile package.

Figure 3:
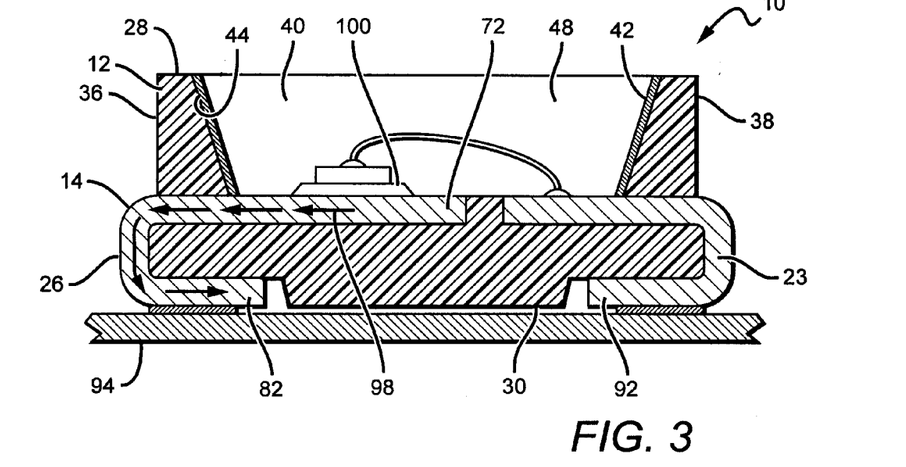
FIG. 3 is a cross section view of the embodiment of FIG. 1 as seen along the line 3-3 in FIG. 2.
Figure 4:
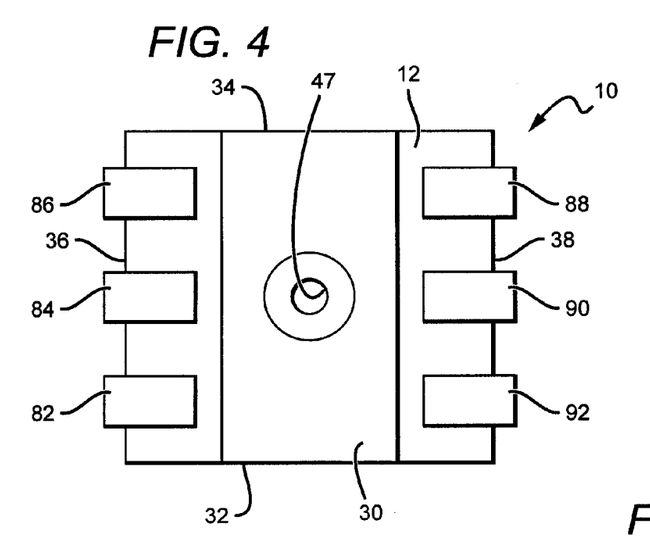
FIG. 4 is a bottom view of the embodiment shown in FIG. 1.
Figure 5:
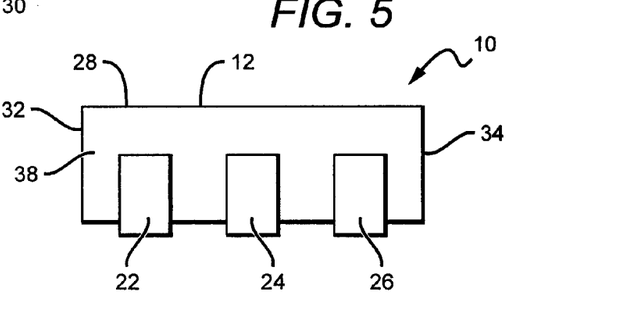
Figure 6:
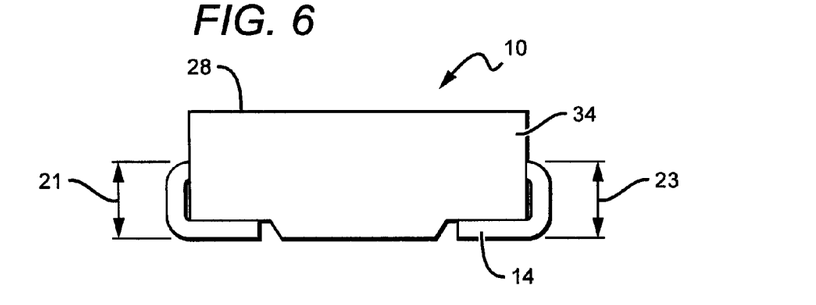

As best shown in FIG. 3, the end portions 82, 84, 86, 88, 90, 92 (with only end portions 82, 92 being visible) of the leads can be electrically connected or bonded to traces or pads on the support structure 94 using any of a number of well-known connection techniques, including soldering. It is understood that in other embodiments all or some of the end portions 82, 84, 86, 88, 90, 92 can be bent in an opposite direction while still allowing for surface mounting.

The cathode parts 16, 18, 20 comprise central surfaces or mounting pads 68, 70, 72 for carrying the LED chips 50, 52, 54 in a linear array that extends in a direction 74 perpendicular to the side surfaces 32 and 34, with the LEDs 50, 52, 54 being aligned generally along a central axis of the casing 12. This alignment allows for improved color uniformity at different horizontal viewing angles compared to packages having LEDs arranged in other ways, such as in a cluster. It is understood that a linear array extending in a direction perpendicular to side surfaces 36, 38 would allow for improved color uniformity at different vertical viewing angles. However, it is also understood that the LEDs do not have to be linearly aligned, and can be arranged in any desired manner on the mounting portions of the lead frame.

Mounting pads 68 and 78 may extend toward the center of the casing 12, which allows for the LEDs 50, 54 to be mounted closer to the center of the casing 12 so they can emit out of the cavity 40. The anode parts 22, 24, 26 include electrical connection pads 76, 78, 80, respectively, positioned adjacent to, but spaced apart from, the mounting pads 68, 70, 72 via gap 96. Connection pads 76 and 80 extend toward the center of the casing 12 to allow for electrical connection to LED 50, 54 that are mounted closer to the center of the casing 12 by extensions of mounting pads 68, 70.

The cathode parts 16, 18, 20 run generally parallel to one another and anode parts 22, 24, 26 run generally parallel to one another as well, with all extending in a direction perpendicular to the direction 74 of the LED array. The leads can have different widths and can be small enough that when the package 10 is viewed from the top, they are minimally visible or not visible. Additionally and/or alternatively, the leads may be obstructed from view from the top by the casing 12.

Figure 1:
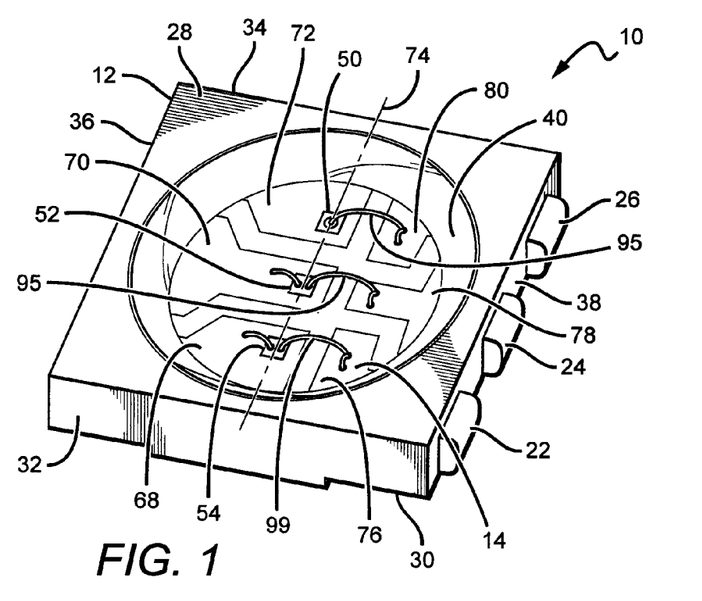
FIG. 1 is a perspective view of an emitter package according to the present invention.
Figure 2:
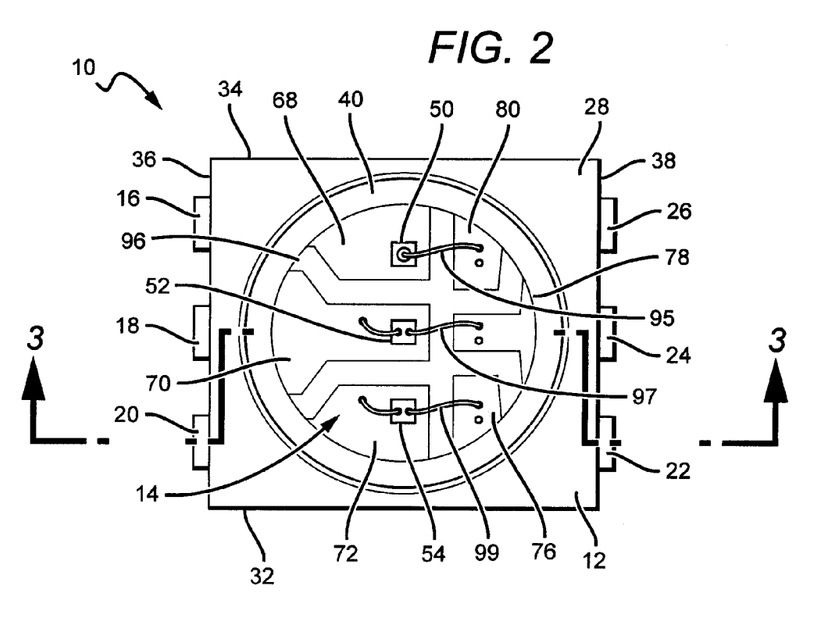
FIG. 2 is a top plan view of the embodiment shown in FIG. 1.

As best seen in FIG. 2, the cavity 40 extends into the casing interior a sufficient depth to expose the attach and connection pads 68, 70, 72, 76, 78, 80. In a possible embodiment, each of the LEDs 50, 52, 54 has its own pair of contacts or electrodes arranged so that when an electrical signal is applied across the contacts, the LED emits light. The contacts of the LEDs are electrically connected to an anode and cathode part pair. Ensuring that each of the LEDs 50, 52, 54 has its own cathode and anode pair can be advantageous for a number of reasons, such as providing easier electrical control of each LED.

In accordance with a typical implementation of the embodiments shown, one of the contacts of LEDs 50, 52, 54 is coupled to the chip carrier pads 68, 70, 72, while the other of LEDs 50, 52, 54 contacts is coupled to the pads 76, 78, 80. However, it is understood that pads 76, 78, 80 can carry the chips instead, with pads 68, 70, 72 being electrically connected to pads 76, 78, 80. Different known structures and methods can be used for making this connection, with one such structure being wire bonds 95, 97, 99 applied using known methods. The wire bonds 95, 97, 99 are described in more detail below.

The cathode parts 16, 18, 20 and anode parts 22, 24, 26 may be made from an electrically conductive metal or metal alloy, such as silver (Ag), copper, a copper alloy, and/or other suitable electrically conductive, low resistivity, corrosion resistant materials or combinations of materials. As noted, the thermal conductivity of the leads may assist, to some extent, in conducting heat away from the LEDs 50, 52, 54 carried by the SMD as shown by the arrows 98. However, in lower power packages (such as those operating at ~20-60 mA) of the present embodiment, thermal management may not be a key concern.

Each of the LEDs 50, 52, 54 may be electrically coupled with one of pads 68, 70, 72 by means of an electrically and thermally conductive bonding material 100 such as a solder, adhesive, coating, film, encapsulant, paste, grease and/or other suitable material. In one embodiment, the LEDs may be electrically coupled and secured to their respective pads using a solder pad on the bottom of the LEDs. The fabrication of the carrier parts 16, 18, 20 and connector parts 22, 24, 26 may be accomplished by stamping, injection molding, cutting, etching, bending or through other known methods and/or combinations of methods to achieve the desired configurations. For example, the connector parts and/or carrier parts can be partially metal stamped (e.g., stamped simultaneously from a single sheet of relevant material), appropriately bent, and finally fully separated following the formation of some or all of the casing.

In some methods of manufacturing, the LEDs may be coupled to the pads 68, 70, 72 prior to molding and/or assembling the casing 12 about the connection pads. Alternatively, the LEDs may be coupled to the pads 68, 70, 72 after the anode and cathode parts have been partially encased within the casing. The cavity 40 that extends into the casing may be configured, such as by a differently shaped bottom portion 41, so that sufficient portions of the pads 68, 70, 72 and pads 76, 78, 80 are exposed to receive the LEDs and the associated wire bonds, and to allow the LEDs to emit light out through the cavity 40.

In conventional packages, the smooth surfaces and narrow paths between the lead frame's various parts and the various portions of the casing make reliable adhesion between the lead frame and the casing difficult. These mating smooth surfaces of the lead frame and casing and the narrow paths of casing material between the metal gaps of the lead frame can reduce the integrity of the emitter package structure, which can cause separation of the casing from the lead frame during both use and manufacturing processes such as reflow. Separations between the lead frame and casing can increase the chances of foreign contaminant infiltration (such as water, air or dirt), especially when the packages are used outdoors or in other locations susceptible to adverse environmental conditions. Such infiltration can increase the chances of component failure, which can increase the overall cost of using LEDs in outdoor applications.

To improve the structural integrity of an emitter package and make it more resistant to water and other contaminants, the adhesion reliability between the casing and lead frame is enhanced. This can be accomplished via a variety of lead frame features, all of which enable the casing material to better encompass the lead frame and thus provide better adhesion between the two. Such features are discussed in U.S. Patent Pub. No. 2010/0155748 to Chan et al. and the same assignee of the present application, which is entirely incorporated herein by reference. The features may include through-holes, cuts, bends, projections, indentations, tabs, steps, or metal gaps between adjacent portions of said lead frame, although other features are contemplated.

Figure 7:
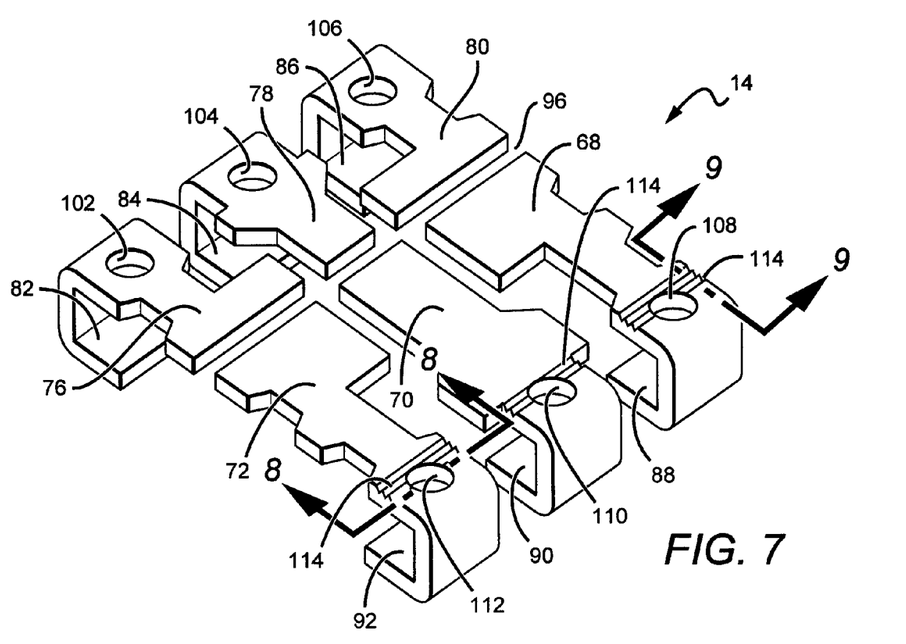
FIG. 7 is a top perspective view of the lead frame in accordance with one embodiment that may be used in the device of FIG. 1.
Figure 8:
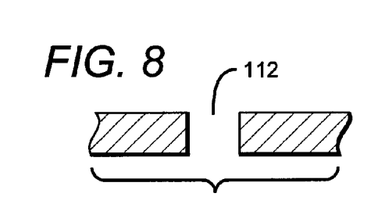
FIG. 8 is a cross section view of one possible embodiment for a package integrity stabilizing mechanism as seen along the line 8-8 in FIG. 7.
Figure 9:
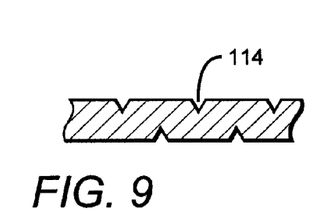
FIG. 9 is a cross section view of another possible embodiment for a package integrity stabilizing mechanism as seen along the line 9-9 in FIG. 7.

FIGS. 7-9 depict several of these features in one possible configuration; other configurations are contemplated by the present invention. Through-holes 102, 104, 106, 108, 110, 112 may be generally located on the top surface of the lead frame, although it is understood that such through-holes may be effectively located in other areas of the lead frame. The casing material can fill the various through-holes and provide a robust connection between the casing and the lead frame. The through-holes in FIG. 7 are shown as circles, but it is understand that any shape is possible. The anode and cathode parts may also contain features such as V-cuts 114, which may be located adjacent to the through-holes. The V-cuts 114 can be on the upper and lower surfaces of the cathode and anode parts, and provide ruts for the casing material to fill in. It is understood that cuts comprising different shapes may also be used within the scope of the present invention.

In addition to through-holes and V-cuts, other features may be included in a lead frame to enhance adhesion. For example, metal gaps may be provided at various locations between adjacent carrier and connection parts of the lead frame, with these gaps having greater and varying widths than the narrow paths seen in conventional emitter packages. Indentations may also be provided to provide additional paths for casing material to occupy. The gaps and indentations are later filled with casing material to form thicker paths and/or path segments and additional paths between these lead frame portions compared to packages not comprising the larger metal gaps and indentation features. Stepped portions may also be provided anywhere along the lead frame, and in addition to improving the adherence between the lead frame and casing, they may also make it more difficult for any moisture or other environmental contaminants that may have infiltrated the package to reach the light emitting devices. The various other lead frame features may provide this advantage as well. The stabilizing features of the lead frame may also cooperate with the encapsulant, at least in part, to enhance the structural stability and integrity of the package 10.

Figure 10:
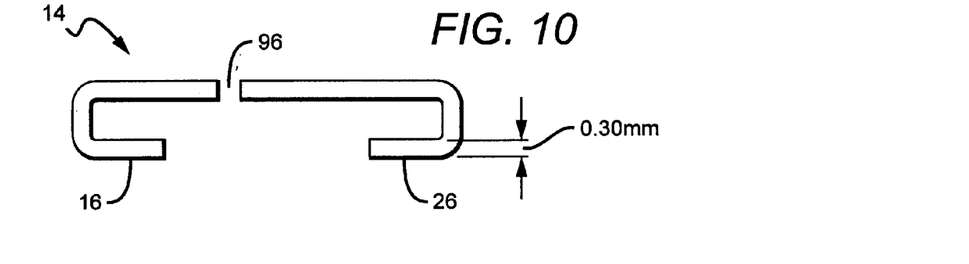
FIG. 10 is a side dimensional view of one embodiment of a lead frame according to the present invention.
Figure 11:
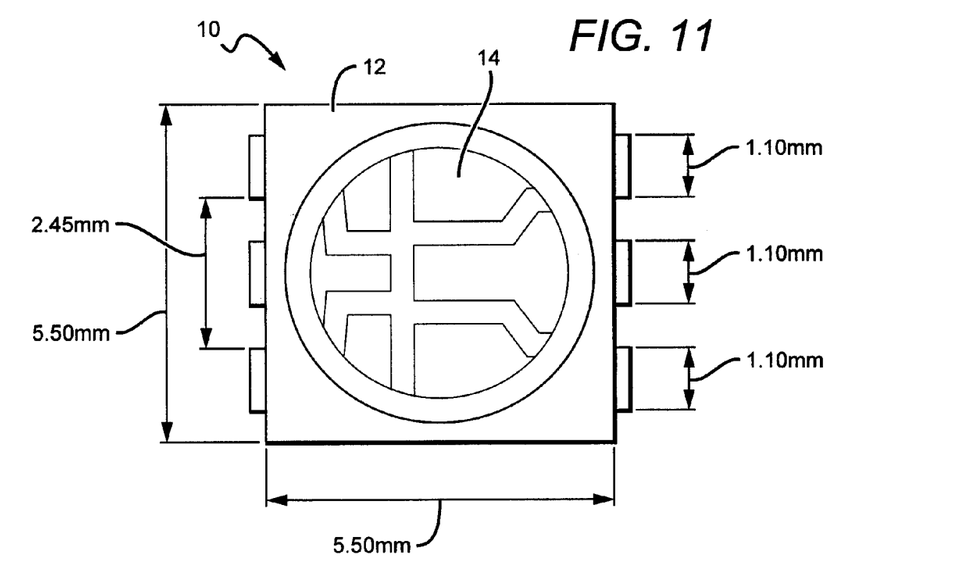
FIG. 11 is a top dimensional view of an emitter package according to the present invention.

With reference now to FIGS. 10-12, some examples of dimensional characteristics of the various components of emitter package 10 are shown. By way of example and not limitation, the package 10 may have an overall length of 5.50 mm, an overall width of 5.50 mm, and a height of 2.50 mm. In other embodiments, the length may be less than or greater than 5.50 mm. The overall width may be less than or greater than 5.50 mm. Moreover, each of the lead frame portions extending out the end surfaces of the casing may be 1.10 mm wide or less than or greater than 1.10 mm. The thickness of the lead frame portions may be 0.30 mm, or less than or greater than 0.30 mm. The width of each end portion of the lead frame may be 1.20 mm, or less than or greater than 1.20 mm.

Figure 13:
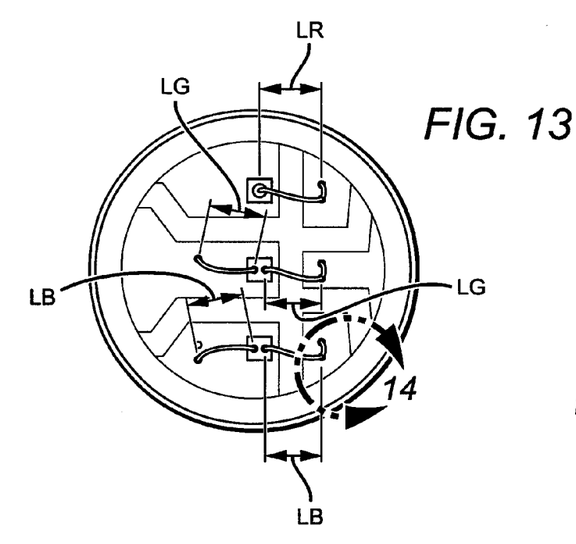
FIG. 13 is a top view of one embodiment of wire bonds according to the present invention.
Figure 14:
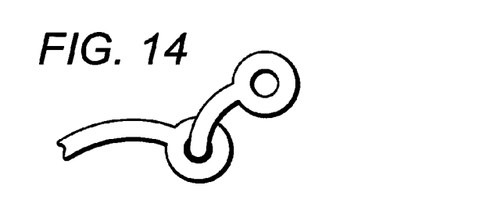
FIG. 14 is a section view of a security bond according to the present invention as seen along the section line 14 in FIG. 13.
Figure 15:
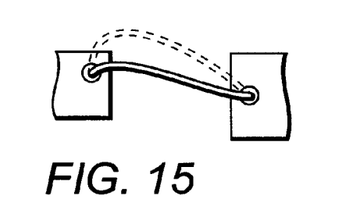
FIG. 15 is a side perspective view of one possible embodiment of a wire bond loop height according to the present invention.

FIGS. 13-15 depict various wire bond configurations that may be incorporated to improve the reliability of the wire bonds when they are to be used in waterproof packages according to the present invention. In extreme environmental conditions (e.g. high moisture environments, extreme temperatures, and high-sun environments), the integrity of wire bonds can become compromised, leading to wire breakage, detachment from the carrier and/or connective portions of the lead frame, bending, and/or failure. Moreover, the wire bonds can become damaged during manufacture, such as when the encapsulant is applied over the package. However, controlling the length, thickness, and loop height of the wire bonds can improve the reliability of the wire bonds during manufacture and use in extreme environments.

For example, in FIG. 13, shorter wire bonds than those provided in conventional packages are shown. The length of each wire bond is preferably controlled at ≤750 µm, although it is understood that the wire bond length will be dependent on the package size, LED configuration, and lead frame arrangement. Accordingly, the wire bonds may also be >750 µm, so long as their length is minimized between the connection and carrier parts. The shorter wire bonds can help reduce stress between the wire and the encapsulant, as wires can become broken by the encapsulant. This is especially true when the encapsulant is comprised of a harder material such as epoxy. The shorter wire bonds also ensure that there is minimal wire in contact and/or above the carrier and connection portions of the lead frame, which can also help reduce breakage and/or detachment.

FIG. 14 discloses a security bond which may be incorporated to protect the first wire bond from a potentially weak bond on the connection or carrier portion of the lead frame. As shown, the security wire bond provides additional adhesion of the primary wire bond to the connection or carrier part of the lead frame, which can help reduce breakage and/or detachment due to weak bonds. In some embodiments, the security bond may comprise a ball or loop bond that overlaps the original bond and the corresponding connection or carrier portion of the lead frame, and then another bond is made on the connection or carrier portion near or on the overlapping bond.

An additional feature of the wire bonds that may be controlled for optimal integrity is the thickness of the wire used for the wire bonds. In conventional low power, RGB packages, 1.0 mil gold wire is typically utilized. However, the thinner wire may not hold up well against the encapsulant and harsh environmental conditions, thus necessitating incorporation of a thicker wire for the wire bonds. Accordingly, 1.2 mil wire may be incorporated according to one possible embodiment of the present invention. In other possible embodiments, >1.0 mil wire may be incorporated. The thicker wire may enhance the bonding of the wire in the package, as well as prevent breakage due to the stress from a harder encapsulant material such as epoxy. However, it is understood that various other wire sizes may be incorporated according to the present invention.

Moreover, the loop height of the wire bonds may be preferably controlled to improve the overall integrity of the wire bonds. As shown in FIG. 15, the loop height of wire bonds in conventional packages (depicted by the dotted line) can be quite high, which can lead to wire bending and increased likelihood of wire bond failure. In one embodiment according to the present invention, the loop height is controlled as low as is manufacturable in order to reduce the likelihood of wire bending and increase the reliability of the wire bonds. In one possible embodiment, a loop height of ≤100 µm may be desired. In other embodiments, a loop height of <50 µm, <90 µm, or >100 µm may be desired. It is understood that a desired loop height will vary depending on the overall dimensions of the package, the material to be used for the encapsulant, and the end use of the package; overall, a loop height that is as low as is manufacturable for a given package is desirable.

Figure 16:
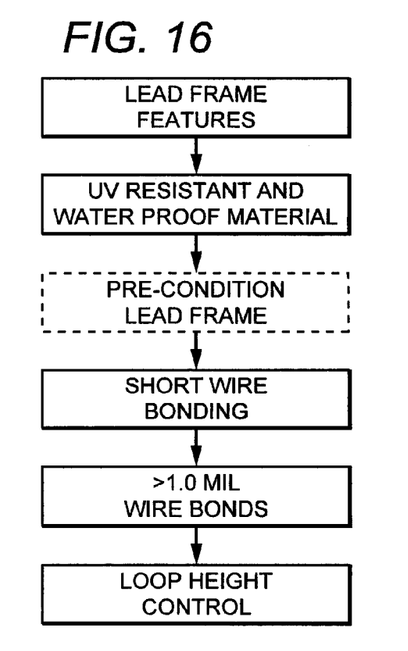
FIG. 16 is a schematic view of one possible method for making a waterproof emitter package according to the present invention.

In at least one method according to the present invention, an emitter package can be produced using techniques to optimize UV-resistance, waterproof characteristics, adhesion among the various package components, and component integrity. As schematically depicted in FIG. 16, the method may comprise inclusion of a lead frame comprising structural features as discussed in detail above. Such features will help optimize adhesion between the casing and the lead frame to improve overall structural stability of the package. The method may also comprise utilizing UV damage-resistant and waterproof material for the emitter package, with white PPA suitable for the casing and a UV-resistant epoxy suitable for the encapsulant (although other suitable materials are also contemplated).

Furthermore, the method may include an optional step for pre-conditioning the lead frame prior to incorporation into the emitter package. The optional pre-conditioning step may include any one or a combination of any of the following techniques: exposing the lead frame to one or more solvents such as acetone, methanol, isopropyl alcohol, water, deionized water, soap, xylene, or other known organic solvents; plasma etching/ashing or drying the lead frame using gas(es) such as Ar, $O_2$, $N_2$, Cl, F, or the like; vacuum degreasing the lead frame; baking the lead frame, physically scrubbing the lead frame with or without a solvent; exposing the lead frame to various acids or bases; etching the under-layer of the lead frame; exposing the lead frame to standard semiconductor processes known in the art such as RCA, IMEC or Ohmi clean; using hydrogen peroxide to clean the lead frame; placing the lead frame in an ultrasonic at various temperatures and time durations (e.g. at ≥80° C., <80° C., ≥50° C., or <50° C. at time durations such as ≥15 minutes, <15 minutes, ≥10 minutes, or <10 minutes); using ozone cleaning; using $CO_2$ Snow cleaning; exposing the lead frame to argon/nitrogen cryogenic aerosol; and/or, using Supercritical carbon dioxide ($SCCO_2$) cleaning methods on the lead frame. However, it is understood that still other appropriate lead frame cleaning methods are contemplated by the present invention. The optional pre-conditioning step may improve the wire bond strength and enhance adhesion among the encapsulant, casing, and lead frame.

In a next step according to one possible method (and as discussed above), the wire bonds may be applied to the lead frame portions and the light emitting devices, with the wire bonds being controlled for length, thickness, and height. The wire bonds may be shorter than conventional wire bonds such that stress is reduced between the wire and the encapsulant and such that there is minimal wire in contact with and above the carrier and connection portions of the lead frame. Moreover, the wire bonds may comprise wire that is thicker than conventional wire bonds such that bonding is enhanced and the likelihood of wire breaking from a high stress encapsulant is reduced. Finally, the loop height of the wire bonds is controlled to be as low as is manufacturable, which may help reduce unwanted bending of the wires.

In an LED display according to the present invention, a driver PCB may be provided, upon which a large number of SMDs according to the present invention may be mounted. The SMDs may be arranged in rows and columns, with each SMD defining a pixel. The SMDs may comprise emitter packages such as those embodied by package 10. The SMDs may be electrically connected to traces or pads on a PCB, with the PCB connected to respond to appropriate electrical signal processing and driver circuitry. Each of the SMDs may carry a vertically or horizontally oriented, linear array of blue, red and green LEDs. Such a linear orientation of the LEDs has been found to improve color fidelity over a wide range of viewing angles. However, it is understood that each SMD may alternatively carry other configurations and color combinations of LEDs. The LEDs may be arranged in any linear or non-linear order, and less than or more than three LEDs in any desired color combination may be provided in accordance with the present invention.

While several illustrative embodiments of the invention have been shown and described, numerous variations and alternate embodiments will occur to those skilled in the art, such as utilizing the present invention for LED decorative lighting or the like. Such variations and alternate embodiments are contemplated, and can be made without departing from the spirit and scope of the invention as defined in the appended claims.

We claim:

1. An emitter package, comprising:
a casing comprising a cavity extending into the interior of said casing from a top surface of said casing;
an electrically conductive lead frame integral to said casing, said lead frame comprising v-cuts shaped to receive a casing material;
a plurality of light emitting devices on conductive carrier parts of said lead frame, said light emitting devices and portions of said lead frame exposed through said cavity; and
a plurality of wire bonds electrically connecting each of said light emitting devices to conductive connection parts of said lead frame, wherein the length, thickness, and loop height of said wire bonds is controlled to improve reliability of said package;
wherein said emitter package is substantially UV resistant and waterproof.

2. The emitter package of claim 1, wherein said lead frame comprises features to enhance adhesion between said casing and said lead frame, with the material of said casing encompassing each of said features.

3. The emitter package of claim 2, wherein said lead frame comprises one or more of or any combination of the following: through-holes, cuts, bends, indentations, tabs, steps, or metal gaps between adjacent portions of said lead frame.

4. The emitter package of claim 1, wherein said lead frame further comprises:
a plurality of electrically conductive cathode parts; and
a corresponding plurality of electrically conductive anode parts separate from said cathode parts;
wherein each of said cathode and anode parts are electrically connected to one of said light emitting devices.

5. The emitter package of claim 1, wherein said light emitting devices are adapted to be energized to produce, in combination, a substantially full range of colors.

6. The emitter package of claim 1, wherein said light emitting devices comprise LEDs in horizontal or vertical linear alignment.

7. The emitter package of claim 4, wherein each of said light emitting devices comprises at least two contacts, one of which is electrically coupled to at least one of said cathode parts, and the other of which is electrically coupled to at least one of said anode parts.

8. The emitter package of claim 1, wherein said lead frame is comprised of an electrically conductive metal or metal alloy.

9. The emitter package of claim 1, wherein said light emitting devices comprise red, blue and green LEDs.

10. The emitter package of claim 1, wherein each of said light emitting devices is attached to one of said chip carrier parts via solder and one of said connection parts via at least one of said wire bonds.

11. The emitter package of claim 1, wherein said casing is comprised of a white plastic.

12. The emitter package of claim 1, further comprising an encapsulant over said package, wherein said encapsulant is UV-resistant and comprises epoxy.

13. The emitter package of claim 1, wherein said cavity comprises a reflector.

14. The emitter package of claim 1, wherein the loop height of said wire bonds is controlled at ≤100 μm, <50 μm, <90 μm, or <100 μm.

15. The emitter package of claim 1, wherein the wire used for said wire bonds is comprised of 1.2 mil wire or >1.0 mil wire.

16. The emitter package of claim 1, wherein the length of said wire bonds are controlled at ≤750 μm or >750 μm such that only a minimal portion of each said wire bond is above said connection parts or said carrier parts.

17. The emitter package of claim 1, further comprising one or more Zener diodes electrically connected to said exposed lead frame portions and said light emitting devices.

18. An emitter package, comprising:
a casing comprising a cavity extending into the interior of said casing from a top surface of said casing;
an electrically conductive lead frame integral to said casing, said lead frame comprising through-holes through said electrically conductive lead frame configured for a casing material to fill in;

a plurality of light emitting devices on conductive carrier parts of said lead frame;

an epoxy encapsulant covering said package and filling said cavity; and a plurality of wire bonds electrically connecting each of said light emitting devices to conductive connection parts of said lead frame, wherein the length, thickness, and loop height of said wire bonds is controlled to improve reliability of said package;

wherein said emitter package is substantially UV resistant and waterproof; and wherein said LEDs are adapted to be energized to produce, in combination, a substantially full range of colors.

19. The emitter package of claim 18, wherein said lead frame comprises one or more of any combination of the following to enhance adhesion between said casing and said lead frame: cuts, bends, indentations, tabs, steps, or metal gaps between adjacent portions of said lead frame.

20. The emitter package of claim 18, wherein said lead frame further comprises:

a plurality of electrically conductive cathode parts; and a corresponding plurality of electrically conductive anode parts separate from said cathode parts, wherein at least one of said cathode parts or said anode parts in said pluralities comprises through-holes through said at least one of said cathode parts or anode parts configured for a casing material to fill in;

wherein each of said cathode and anode parts are electrically connected to one of said light emitting devices, and wherein each of said light emitting devices comprises at least two contacts, one of which is electrically coupled to at least one of said cathode parts, and the other of which is electrically coupled to at least one of said anode parts.

21. The emitter package of claim 18, wherein said light emitting devices comprise red, blue and green LEDs in horizontal or vertical linear alignment.

22. The emitter package of claim 18, wherein each of said light emitting devices is attached to one of said chip carrier parts via solder and one of said connection parts via at least one of said wire bonds.

23. The emitter package of claim 18, wherein the loop height of said wire bonds is controlled at ≤100 μm, <50 μm, <90 μm, or >100 μm.

24. The emitter package of claim 18, wherein the wire used for said wire bonds is comprised of 1.2 mil gold wire or >1.0 mil gold wire.

25. The emitter package of claim 18, wherein the length of said wire bonds are controlled at ≤750 μm or >750 μm such that only a minimal portion of each said wire bond is above said connection parts or said carrier parts.

26. An emitter package, comprising:

a casing comprising a cavity extending into the interior of said casing from a top surface of said casing;

an electrically conductive lead frame integral to said casing, said lead frame comprising v-cuts shaped to receive a casing material;

a plurality of light emitting devices on conductive carrier parts of said lead frame; and a plurality of wire bonds electrically connecting each of said light emitting devices to conductive connection parts of said lead frame, wherein the length of said wire bonds is controlled at ≤750 μm to improve reliability of said package;

wherein said emitter package is substantially UV resistant and waterproof.

27. An emitter package, comprising:

a casing comprising a cavity extending into the interior of said casing from a top surface of said casing;

an electrically conductive lead frame integral to said casing, said lead frame comprising v-cuts shaped to receive a casing material;

a plurality of light emitting devices on conductive carrier parts of said lead frame; and a plurality of wire bonds electrically connecting each of said light emitting devices to conductive connection parts of said lead frame, wherein the thickness of said wire bonds is controlled at >1.0 mil to improve reliability of said package.

28. An emitter package, comprising:

a casing comprising a cavity extending into the interior of said casing from a top surface of said casing;

an electrically conductive lead frame integral to said casing, said lead frame comprising through-holes through said electrically conductive lead frame configured for a casing material to fill in;

a plurality of light emitting devices on conductive carrier parts of said lead frame; and a plurality of wire bonds electrically connecting each of said light emitting devices to conductive connection parts of said lead frame, wherein the loop height of said wire bonds is controlled at ≤100 μm to improve reliability of said package.

* * * * *